United States Patent
Tenegal (10) Patent No.: US 10,611,643 B2
(45) Date of Patent: *Apr. 7, 2020

(54) METHOD FOR PRODUCING MULTILAYER SUBMICRON PARTICLES BY LASER PYROLYSIS

(71) Applicant: NANOMAKERS, Rambouillet (FR)

(72) Inventor: Francois Tenegal, Paris (FR)

(73) Assignee: NANOMAKERS, Rambouillet (FR)

( * ) Notice: Subject to any disclaimer, the term of this patent is extended or adjusted under 35 U.S.C. 154(b) by 659 days.

This patent is subject to a terminal disclaimer.

(21) Appl. No.: 14/413,848

(22) PCT Filed: Jul. 5, 2013

(86) PCT No.: PCT/EP2013/064232
§ 371 (c)(1),
(2) Date: Jan. 9, 2015

(87) PCT Pub. No.: WO2014/009265
PCT Pub. Date: Jan. 16, 2014

(65) Prior Publication Data
US 2015/0151976 A1    Jun. 4, 2015

(30) Foreign Application Priority Data
Jul. 12, 2012    (FR) .................................... 12 56710

(51) Int. Cl.
*B01J 19/08*    (2006.01)
*B82Y 30/00*    (2011.01)
(Continued)

(52) U.S. Cl.
CPC ............ *C01B 33/029* (2013.01); *B01J 19/08* (2013.01); *B82Y 30/00* (2013.01); *C01B 32/05* (2017.08);
(Continued)

(58) Field of Classification Search
CPC ....... C01B 33/029; C01B 31/02; C01B 33/02; C01B 33/027; C01B 32/05; B01J 19/08;
(Continued)

(56) References Cited

U.S. PATENT DOCUMENTS 6,387,531 B1    5/2002   Bi et al.
8,822,878 B2    9/2014   Tenegal et al.
(Continued)

FOREIGN PATENT DOCUMENTS

FR    2877591    5/2006
FR    2894493    6/2007
(Continued)

OTHER PUBLICATIONS

Xi et al, "Crystalline Silicon Carbide Nanoparticles Encapsulated in Branched Wavelike Carbon Nanotubes: Synthesis and Optical Properties," J. Phys. Chem. B 2005, vol. 109, pp. 13200-13204 (Year: 2005).*

(Continued)

*Primary Examiner* — Nicholas A Smith
*Assistant Examiner* — Colleen M Raphael
(74) *Attorney, Agent, or Firm* — Young & Thompson (57) ABSTRACT

Disclosed is a method for producing particles, including the steps: introducing, into a reaction chamber, at least one reaction flow including a first chemical element and propagating in a direction of flow; projecting a radiation beam through the reaction chamber, intersecting each reaction stream in one interaction area per reaction flow, to form, in each reaction flow, particle cores including the first chemical element; and introducing, into the reaction chamber, a second chemical element interacting with each reaction flow to cover the particle cores with a layer including the second chemical element. Each reaction flow is preferably free of any agent oxidizing the first chemical element. Preferably a (Continued)

ratio of one atom of the second element is introduced per unit of time for at least two atoms of the first element introduced per unit of time. The second element is preferably introduced in at least one confined flow.

18 Claims, 4 Drawing Sheets

(51) Int. Cl.
    *C01B 32/05*     (2017.01)
    *C01B 33/02*     (2006.01)
    *C23C 16/44*     (2006.01)
    *C01B 33/027*     (2006.01)
    *C01B 33/029*     (2006.01)

(52) U.S. Cl.
    CPC ............ *C01B 33/02* (2013.01); *C01B 33/027* (2013.01); *C23C 16/4417* (2013.01); *B01J 2219/0869* (2013.01); *B01J 2219/0879* (2013.01); *C01P 2004/62* (2013.01); *C01P 2004/64* (2013.01); *C01P 2004/84* (2013.01); *Y10T 428/2993* (2015.01)

(58) Field of Classification Search
    CPC ....... B01J 2219/0879; B01J 2219/0869; C23C 16/4417; C01P 2004/84; C01P 2004/62; C01P 2004/64; B82Y 30/00
    USPC ........................................ 204/157.41, 157.61
    See application file for complete search history.

(56) References Cited

U.S. PATENT DOCUMENTS

| | | | | |
|---|---|---|---|---|
| 9,005,511 | B2* | 4/2015 | Tenegal | B01J 19/121 264/482 |
| 2002/0075126 | A1* | 6/2002 | Reitz | B82Y 30/00 338/21 |
| 2003/0118841 | A1* | 6/2003 | Horne | B82Y 30/00 428/425.9 |
| 2003/0203205 | A1* | 10/2003 | Bi | B01J 2/006 428/402 |
| 2004/0229447 | A1 | 11/2004 | Swihart et al. | |
| 2006/0147369 | A1* | 7/2006 | Bi | B01J 4/002 423/594.17 |
| 2007/0295702 | A1 | 12/2007 | Tenegal et al. | |
| 2009/0014921 | A1 | 1/2009 | Tenegal et al. | |
| 2009/0020411 | A1* | 1/2009 | Holunga | B01J 19/121 204/157.41 |
| 2009/0026421 | A1 | 1/2009 | Li et al. | |
| 2015/0325848 | A1* | 11/2015 | Yamashita | H01M 4/587 429/231.4 |

FOREIGN PATENT DOCUMENTS

| | | |
|---|---|---|
| JP | 2007-246329 A | 9/2007 |
| JP | 2009-518174 A | 5/2009 |
| JP | 2012-254899 A | 12/2012 |

OTHER PUBLICATIONS

Hwa et al, "High capacity and rate capability of core-shell structured nano-Si/C anode for Li-ion batteries," Electrochimica Acta vol. 71 (2012) pp. 201-205. (Year: 2012).*
Xu et al, "Nanosized core/shell silicon@carbon anode material for lithium ion batteries with polyvinylidene fluoride as carbon source," J. Mater. Chem., 2010, vol. 20, pp. 3216-3220. (Year: 2010).*
French search report, dated Apr. 8, 2013, in corresponding French Patent Application No. 1256710.
F. Huisken, et al. "Silicon carbide nanoparticles produced by CO2 laser pyrolysis of SiH4/C2H2 gas mixtures in a flow reactor," Journal of Nanoparticle Research 1: 293-303, 1999.
International search report, dated Feb. 13, 2014, in corresponding International Patent Application No. PCT/EP2013/064232.
Japanese Office Action issued in Application No. 2015-520925, dated May 2, 2017.

* cited by examiner

METHOD FOR PRODUCING MULTILAYER SUBMICRON PARTICLES BY LASER PYROLYSIS

TECHNOLOGICAL FIELD

The present invention relates to a process for producing multilayer particles (typically a core layer covered by an upper layer), typically by laser pyrolysis. It also relates to an associated device.

Such a process for example allows a user to produce submicron particles of silicon each covered with a layer of carbon.

PRIOR ART

A process is known for producing particles of silicon oxide covered with a layer of carbon by laser pyrolysis as described in the document U.S. Pat. No. 6,387,531.

However, such a process has several drawbacks:
the types and possible number of uses of these particles are limited and it could be sought to produce particles enabling novel uses, and
the homogeneity of distribution and thickness of the carbon layer on each silicon particle core is open to improvement.

The purpose of the invention is to remedy at least one or more of the drawbacks listed above.

DISCLOSURE OF THE INVENTION

This objective is achieved with a process for producing particles, comprising the following steps:
introducing into a reaction chamber at least one reaction flow comprising a first chemical element (typically silicon) and propagating along a flow direction,
projecting a radiation beam through the reaction chamber, intersecting each reaction flow in one interaction zone per reaction flow in order to form, in each reaction flow, particle cores comprising the first chemical element, and
introducing, into the reaction chamber, a second chemical element (typically carbon) interacting with each reaction flow in order to cover the particle cores with a layer comprising the second chemical element.

Each reaction flow is preferably devoid of agent oxidizing the first chemical element, and the particle cores preferably comprise the first chemical element in non-oxidized form.

Thus, by not using any oxidizing agent for oxidizing the first chemical element, particles can be obtained, the core of which comprises the first element in non-oxidized form. The layer of second element protects the core from oxidation, and makes it possible:
to keep the first element in a non-oxidized state, which leaves more options for possible uses of the particles produced: either keeping the first element of the core non-oxidized for novel uses of non-oxidized particles, or removing the layer of second element (for example by heating, under a controlled atmosphere, particles of non-oxidized silicon covered with a layer of carbon, providing silicon particles (oxidized or non-oxidized) with no carbon layer and releasing $CO_2$) in order to allow use of the first element in pure form for other more standard uses, and
to avoid the effects of spontaneous ignition of the core (for example non-oxidized silicon) by ambient oxygen.

Thus, such a process according to the invention for example allows a user to produce submicron particles of non-oxidized silicon each covered with a protective carbon layer preventing any oxidation of the silicon core of each of the particles.

The number of atoms of the second element introduced relative to the number of atoms of the first element introduced preferably corresponds to a ratio of one atom of the second element introduced per unit of time to at least two atoms of the first element introduced per unit of time. For a lesser ratio (for example one atom of the second element of carbon introduced into a reaction flow per unit of time for one atom of the first element of silicon introduced per unit of time into that reaction flow), the reaction would be different (for example obtaining silicon carbide particles).

The second chemical element can be introduced into the chamber in a gas flow surrounding each reaction flow.

This embodiment significantly improves the homogeneity of distribution and thickness of the layer of second element on each particle core. Indeed, it was observed that in the case where the second chemical element is introduced into the chamber with the first chemical element in each reaction flow, the homogeneity of distribution and thickness of the layer of second element on each particle core is not perfect, especially if in each reaction flow no agent for oxidizing the first chemical element is used.

The second chemical element can be introduced into the chamber in a peripheral gas flow surrounding each reaction flow, emitted from several points distributed along a closed curve surrounding each reaction flow and propagating in the direction of each reaction flow. The second chemical element is preferably introduced into the chamber in the peripheral gas flow after the interaction zone of each reaction flow.

The process according to the invention can further comprise a step of introducing into the reaction chamber, before the interaction zone of each reaction flow, a confinement gas flow surrounding each reaction flow and propagating along the flow direction. The second chemical element can be introduced into the chamber in the confinement gas flow before the interaction zone of each reaction flow.

The introduction of at least one reaction flow can comprise introduction of at least one alignment of several reaction flows separated from one another by the confinement gas flow and each reaction flow comprising the first chemical element and each reaction flow propagating along the flow direction.

The radiation beam can propagate along a radiation direction preferably perpendicular to the flow direction, and the flows of each reaction flow alignment can be aligned along an alignment direction perpendicular to the flow direction and to the radiation direction.

The radiation beam can propagate along a radiation direction preferably perpendicular to the flow direction, and each reaction flow can have, in a plane perpendicular to the flow direction, a cross-section extending longitudinally along an elongation direction perpendicular to the flow direction and the radiation direction.

The second chemical element can be introduced into the chamber with the first chemical element in each reaction flow before the interaction zone of each reaction flow.

The first chemical element is preferably silicon.

The first chemical element is preferably introduced into the chamber in the form of $SiH_4$.

The particle cores can be of silicon.

The second element is preferably carbon.

According to yet another aspect of the invention, particles obtained by the process according to the invention are proposed.

According to yet another aspect of the invention, particles are proposed each comprising:
- a core comprising (preferably consisting solely of) a first non-oxidized chemical element (preferably silicon), having a diameter comprised between 3 and 900 nm (preferably with a standard deviation between 1 and 90 nm), and
- a layer surrounding the core, comprising (preferably consisting solely of) a second chemical element (preferably carbon) and having a layer thickness (not necessarily homogeneous) of at least 0.5 nm, preferably between 0.5 and 10 nm.

According to yet another aspect of the invention, a device for producing particles is proposed, comprising:
- a reagent source comprising reagent, this reagent comprising a first chemical element;
- a reaction chamber connected to the reagent source;
- a reagent injector arranged in order to introduce, into the chamber and originating from the reagent source, at least one reaction flow comprising said reagent and propagating along a flow direction into one reaction flow zone per reaction flow,
- an emitter of a radiation beam arranged in order to project the radiation beam through the reaction chamber intersecting each reaction flow zone in one interaction zone per reaction flow,
- a source of a second chemical element, and
- an injector of second element arranged in order to introduce, into the reaction chamber, the second chemical element from the source of second element so that this second chemical element is able to interact with each reaction flow in the chamber.

The reagent is preferably devoid of agent arranged for oxidizing the first chemical element.

The injector of second element and the injector of first element are preferably arranged together in order to introduce a number of atoms of the second element relative to a number of atoms of the first element in a ratio of one atom of the second element to at least two atoms of the first element.

The injector of second chemical element can be arranged in order to introduce the second chemical element into the chamber in a gas flow surrounding each reaction flow.

The injector of second chemical element can be arranged in order to introduce the second chemical element into the chamber in a
peripheral gas flow surrounding each reaction flow, emitted from several points distributed along a closed curve surrounding each reaction flow and arranged in order to direct the peripheral gas flow in the direction of each reaction flow. The injector of second chemical element can be arranged in order to introduce the second chemical element into the chamber in the peripheral gas flow after the interaction zone of each reaction flow.

The device according to the invention can further comprise an injector of confinement gas arranged in order to introduce into the reaction chamber, before the interaction zone of each reaction flow, a confinement gas flow surrounding each reaction flow and propagating along the flow direction. The injector of second chemical element can comprise the injector of confinement gas.

The injector of at least one reaction flow can be arranged in order to introduce into the chamber at least one alignment of several reaction flows separated from one another by the confinement gas flow and each reaction flow comprising the first chemical element and each reaction flow propagating along the flow direction.

The emitter can be arranged so that the radiation beam propagates along a radiation direction preferably perpendicular to the flow direction, and the injector of at least one reaction flow can be arranged so that the flows of each reaction flow alignment are aligned along an alignment direction perpendicular to the flow direction and the radiation direction.

The emitter can be arranged so that the radiation beam propagates along a radiation direction preferably perpendicular to the flow direction, and the injector of at least one reaction flow can be arranged so that each reaction flow has, in a plane perpendicular to the flow direction, a cross-section extending longitudinally along an elongation direction perpendicular to the flow direction and to the radiation direction.

The injector of second chemical element can be arranged in order to introduce the second element into the chamber with the first chemical element
in each reaction flow before the interaction zone of each reaction flow.

DESCRIPTION OF THE FIGURES AND EMBODIMENTS

Other advantages and characteristics of the invention will become apparent on reading the detailed description of implementations and embodiments which are in no way limitative, and from the following attached drawings.

These embodiments being in no way limitative, it will in particular be possible to consider variants of the invention comprising only a selection of characteristics described below in isolation from other characteristics described (even if that selection is isolated within a sentence comprising those other characteristics), if that selection of characteristics is sufficient to confer a technical advantage or to differentiate the invention relative to the prior state of the art. That selection comprises at least one characteristic which is preferably functional without structural details, or with only a part of the structural details if that part alone is sufficient to confer a technical advantage or to differentiate the invention relative to the prior state of the art.

First of all, a first embodiment of a device 9 according to the invention will be described, with reference to FIGS. 1 to 6.

This first embodiment of the device 9 for producing particles 10 by laser pyrolysis comprises a reagent source 4. The reagent preferably comprises at least one reaction gas and/or at least one reaction liquid in aerosol form. The reagent comprises a first chemical element. The first chemical element is preferably a metal (preferably selected from iron, aluminium or titanium) or a metalloid (selected from boron, silicon, germanium, arsenic, antimony, tellurium or polonium). More precisely, the first chemical element in the reagent is preferably silicon, preferably in the form of $SiH_4$. The reagent is preferably reaction gas (typically $SiH_4$ gas or $SiH_4+C_2H_2$ gas or $SiH_4+C_2H_4$ or $SiH_4+CH_4$).

The device 9 further comprises a reaction chamber 8 (delimited by stainless steel walls) connected to the reagent source 4.

The reaction chamber 8 is filled with a neutral gas atmosphere (selected from helium, argon, krypton, xenon, nitrogen or a mixture), preferably argon or nitrogen.

A reagent injector 5 is arranged in order to introduce, into the chamber 8 and originating from the reagent source 4, at least one reaction flow 1, 100, 101, 102, 103, 104, 105, 106, each reaction flow propagating along a flow direction 11 identical for all the reaction flows and into one reaction flow zone 6 per reaction flow.

An emitter 19 (typically a LASER source) of a radiation beam 3 (typically a laser beam, preferably with an area between 30 mm² and 3000 mm² in a cross-section which is perpendicular to the direction 12, with a width comprised between 2 and 5 cm along the direction 13 or 18, with a wavelength comprised between 9 microns and 11 microns, preferably 10.6 microns for $SiH_4$ and with a power between 50 and 5000 watts and frequency between 10,000 and 100,000 Hz) is arranged in order to project the radiation beam 3 through the reaction chamber 8 so that this beam 3 intersects, in one interaction zone 14 per reaction flow zone 6, each reaction flow zone 6 so as to form particle cores 15 comprising the first chemical element in each reaction flow.

Thus, each reaction flow 1, 100, 101, 102, 103, 104, 105, 106 or reaction flow zone 6 divides into three parts:
- a zone 14 of interaction with the beam 3,
- a part situated before (relative to flow direction 11) its interaction zone 14 and comprising the reagent as introduced into the chamber 8, and
- a part situated after (relative to flow direction 11) its interaction zone 14 and comprising a flame 26 originating from the interaction between the reagent and the beam 3 in its interaction zone 14.

The beam 3 is shaped by an optical system to give it a focussed rectangular cross-section (i.e. the area of which decreases with the progress of the beam 3 along the radiation direction 12, as described in the documents FR 2 894 493 and FR 2 877 591.

The beam 3 enters the chamber 8 through a ZnSe window 23 and emerges from the chamber 8 through another ZnSe window 24 before being stopped by a non-reflecting calorimeter 25 ("beam stopper").

The device 9 further comprises a source of a second chemical element. The second chemical element is preferably carbon injected in the form of gaseous $C_2H_2$ or $C_2H_4$ or $CH_4$. An injector of second element is arranged in order to introduce, into the reaction chamber 8, the second chemical element from the source of second element so that this second chemical element is able to interact in the chamber 8 with each reaction flow 1, 100 101, 102, 103, 104, 105, 106 so as to cover the particle cores 15 with a layer 16 comprising the second chemical element.

The reagent in the source 4 and injected into the chamber 8 is devoid of oxidizing agent arranged for oxidizing the first chemical element. By "agent arranged for oxidizing the first chemical element" (also referred to as "first chemical element oxidizing agent") is meant any atom or molecule (for example $N_2O$) which, in the reagent (for example an $SiH_4$ gas, optionally mixed with $C_2H_2$ or $C_2H_4$ or $CH_4$), has an oxidation-reduction potential tending to oxidation of the first chemical element (for example Si) from the form (for example $SiH_4$) in which it is injected into the chamber 8. Preferably, the reagent in the source 4 and injected into the chamber 8 is devoid of oxygen atoms.

The injector (5, 21 and/or 22) of second element and the injector 5 of first element are arranged together within the device 9 (in terms of their flow rate and their proportions of the different, optionally mixed, gases which they deliver such as $SiH_4$ for the injector 5, argon or nitrogen for the injector 21 and $C_2H_2$, $C_2H_4$ or $CH_4$ for the injector 5 and/or 21 and/or 22) in order to introduce per unit of time (typically per minute) a number of atoms of the second element relative to a number of atoms of the first element in a ratio of one atom of the second element (typically carbon) introduced (in the sum of the reaction flows 1, 100, 101, 102, 103, 104, 105, 106, confinement flow 2 and optionally, if they exist, peripheral flows 7) per unit of time to at least two (preferably at least 3, optimally at least 5) atoms of the first element (typically silicon) introduced (into flow 1) per unit of time.

Typically, the injector (5, 21 and/or 22) of second element and the injector 5 of first element are arranged together within the device 9 in order to introduce a ratio of one atom of the second element (typically carbon) (in the sum of the reaction flows 1, 100, 101, 102, 103, 104, 105, 106, confinement flow 2 and optionally, if they exist, peripheral flows 7) per unit of time to two (preferably three, optimally five) to fifty atoms of the first element (typically silicon) per unit of time (into flow 1).

The device 9 further comprises a source 20 of confinement gas comprising confinement gas and an injector 21 of confinement gas arranged in order to introduce into the reaction chamber 8, before (relative to flow direction 11) the interaction zone 14 of each reaction flow, a confinement gas flow 2 (preferably common to all the reaction flows) surrounding each reaction flow 1, 100 101, 102, 103, 104, 105, 106 (more precisely in contact with each reaction flow 1, 100, 101, 102, 103, 104, 105, 106 over the whole periphery of each reaction flow 1, 100, 101, 102, 103, 104, 105, 106 at least from the injection of the reagent into the chamber 8 up to the interaction zone 14 of each reaction flow, this periphery being defined in accordance with a fixed line contained in a plane perpendicular to the flow direction 11) and propagating along the flow direction 11.

The confinement gas comprises a neutral gas (selected from helium, argon, nitrogen or a mixture thereof, preferably argon or nitrogen). The confinement gas flow 2 has two functions:

- firstly, it serves to confine each reaction flow in order to prevent the reagents of each reaction flow from diffusing radially, which would risk soiling the internal walls of the chamber 8, and
- secondly, to cool ("quench effect") each reaction flow flame 26 created after (relative to flow direction 11) the interaction of the beam 3 with each reaction flow 1, 100, 101, 102, 103, 104, 105, 106 respectively.

The emitter 19 is arranged so that the radiation beam 3 propagates along a radiation direction 12 perpendicular to the flow direction 11.

The injector 5 of at least one reaction flow 1, 100, 101, 102, 103, 104, 105, 106 is arranged so that each reaction flow 1, 100, 101, 102, 103, 104, 105, 106 has, in a plane perpendicular to the flow direction 11, a cross-section extending longitudinally along an elongation direction 13 perpendicular to the flow direction 11 and to the radiation direction 12.

Figure 1:
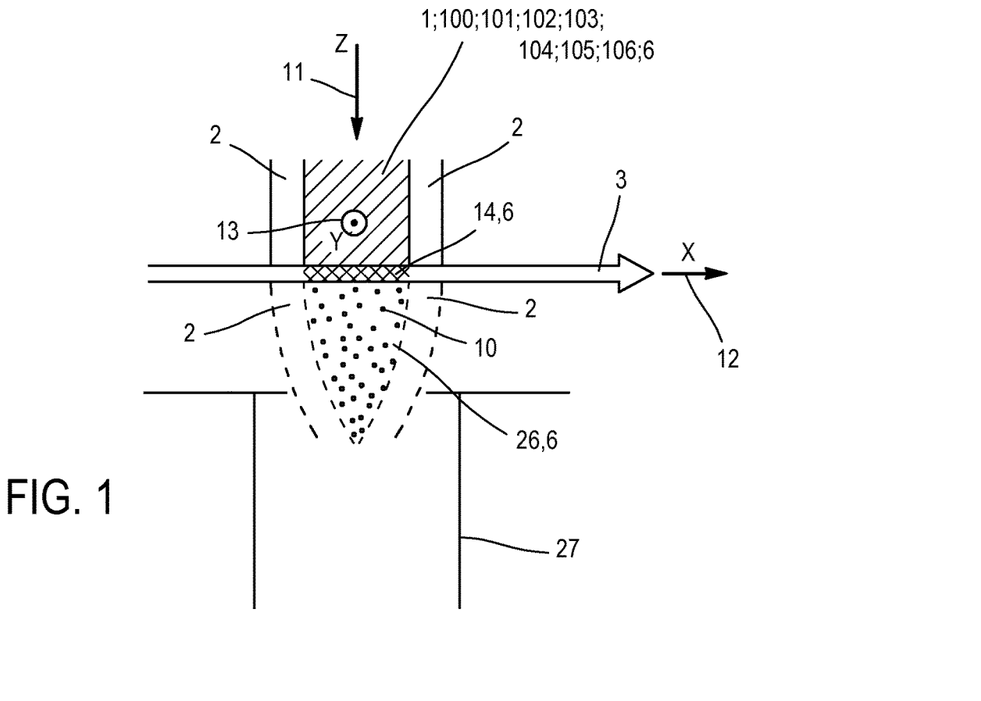
FIG. 1 is a diagrammatic side cross-section view of a reaction flow (which may be the flow 1, 100, 101, 102, 103, 104, 105 or 106 depending on the variant considered) in a device according to the invention.
Figure 2:
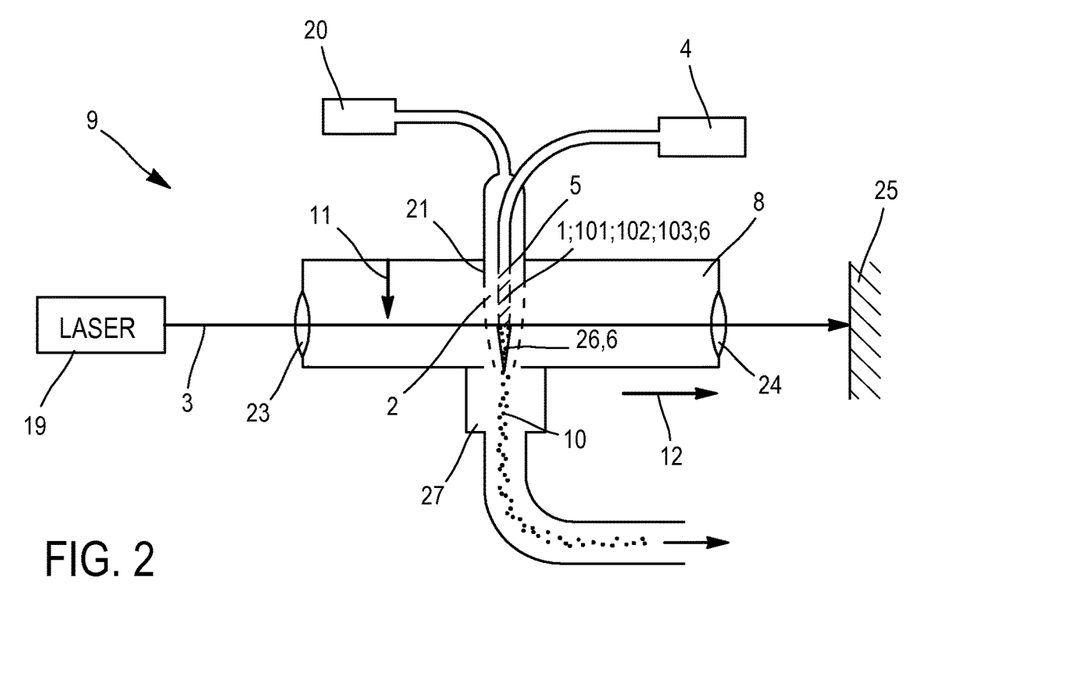
FIG. 2 is a diagrammatic side cross-section view (which may be of the flow 1, 101, 102, or 103 depending on the variant considered) of a device according to the invention.

In a first variant of the first embodiment of the device 9 which can correspond to the cross-section view of FIG. 2, the reagent injector 5 is arranged in order to introduce, into the chamber 8 and originating from the reagent source 4, a single reaction flow 1 propagating along the flow direction 11 in a reaction flow zone 6. The cross-section of the injector 5 is typically an oval 4 mm deep in the direction 12 and 2 cm wide in the direction 13.

Figure 3:
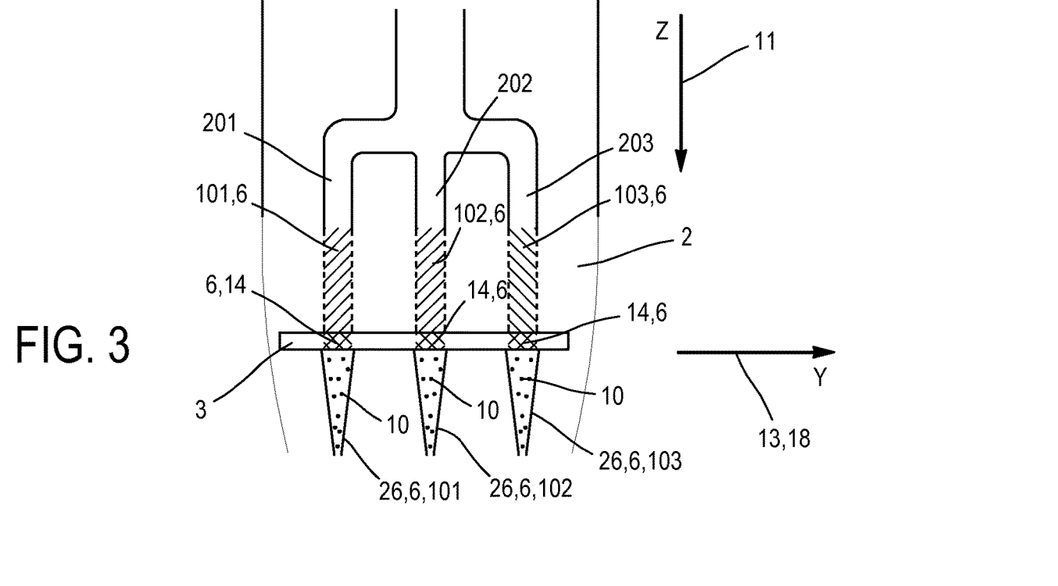
FIG. 3 is a diagrammatic front cross-section view of a reaction flow alignment 101, 102, 103 in a device according to the invention.

In a second variant of the first embodiment of the device 9 which can correspond to the side cross-section view of FIG. 2 and the front cross-section view of FIG. 3, the injector 5 of at least one reaction flow is arranged in order to introduce, into the chamber 8 and originating from the reagent source 4, an alignment of several reaction flows 101, 102, 103 separated from one another by the confinement gas flow 2 and each reaction flow comprising the first chemical element and each reaction flow propagating along the flow direction 11.

Each flow 101, 102 or 103 propagates along the flow direction 11 in a reaction flow zone 6 which is specific to it.

The injector 5 of at least one reaction flow 101, 102, 103 is arranged so that, within the alignment of flows 101, 102, 103, the different reaction flows 101, 102, 103 are aligned along an alignment direction 18 perpendicular to the flow direction 11 and the radiation direction 12.

As illustrated in FIG. 3, the injector 5 is subdivided into several injection nozzles 201, 202, 203 (one nozzle per reaction flow). Each nozzle has a section which is typically an oval 3 mm deep in the direction 12 and 4 mm wide in the direction 13 or 18. The number of reaction flows 101, 102, 103 and nozzles 201, 202, 203 is in no way limited to three; it would be possible to have many more of them, with this number depending on the width of the laser spot which can range from 2 to 5 cm or even more.

Figure 4:
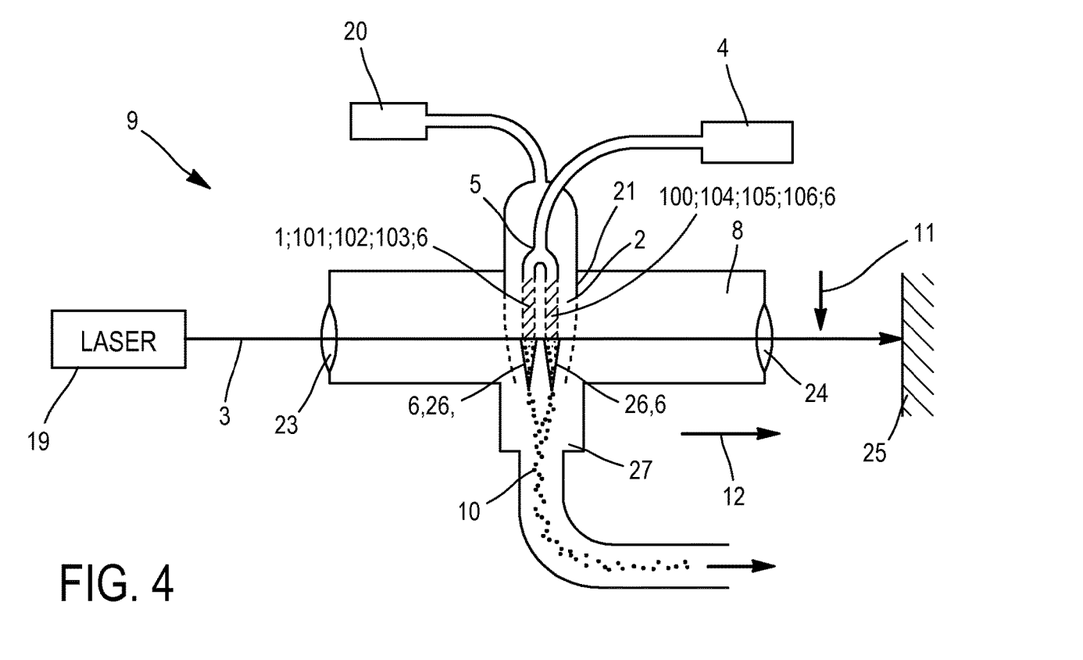
FIG. 4 is a diagrammatic side cross-section view (which may be of the flows 1, 100 or 101, 104 or 102, 105 or 103, 106 depending on the variant considered) of one variant of the device according to the invention.
Figure 5:
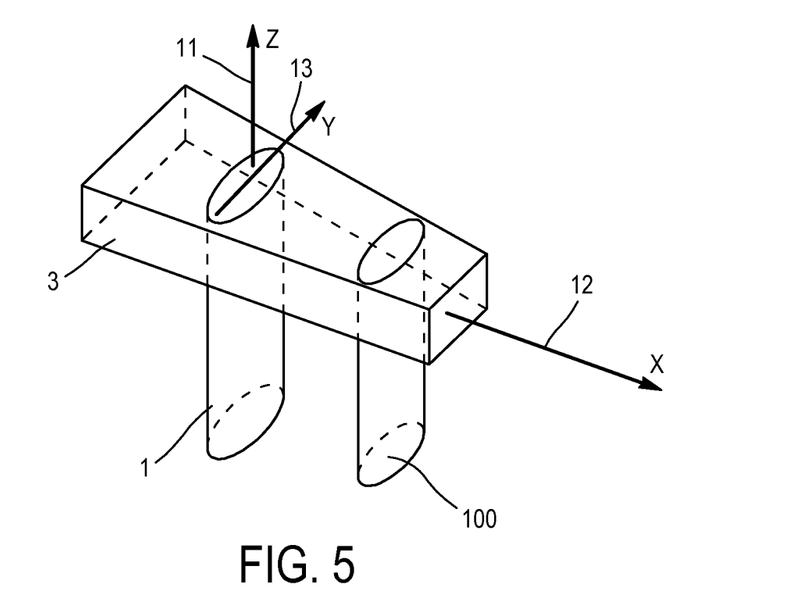
FIG. 5 is a perspective view of a reaction flow 1 accompanied by another optional reaction flow 100.

In a third variant of the first embodiment of the device 9 which can correspond to the side cross-section view of FIG. 4 and the perspective view of FIG. 5, the injector 5 of at least one reaction flow is arranged in order to introduce into the chamber 8 several reaction flows 1, 100, separated from one another by the confinement gas flow 2 and each reaction flow comprising the first chemical element and each reaction flow propagating along the flow direction 11.

The reagent injector 5 is arranged in order to introduce, into the chamber 8 and originating from the reagent source 4, several reaction flows 1, 100, each flow 1, 100 propagating along the flow direction 11 in a reaction flow zone 6 which is specific to it. These flows 1, 100 are spaced along the radiation direction 12.

The losses due to absorption of the beam 3 by the reaction flow 1 are compensated by focussing (or "convergence") of the beam 3 so that the incident power density of the beam 3 on each flow 1 or 100 is identical for all the flows 1, 100 as described in the document FR 2 877 591.

This variant makes it possible to increase the production rate. It is possible to have two flows 1, 100 one after the other as illustrated in FIG. 5, or to have three or four or even more flows, this way one after the others, arranged in line with a single laser beam 3.

Figure 6:
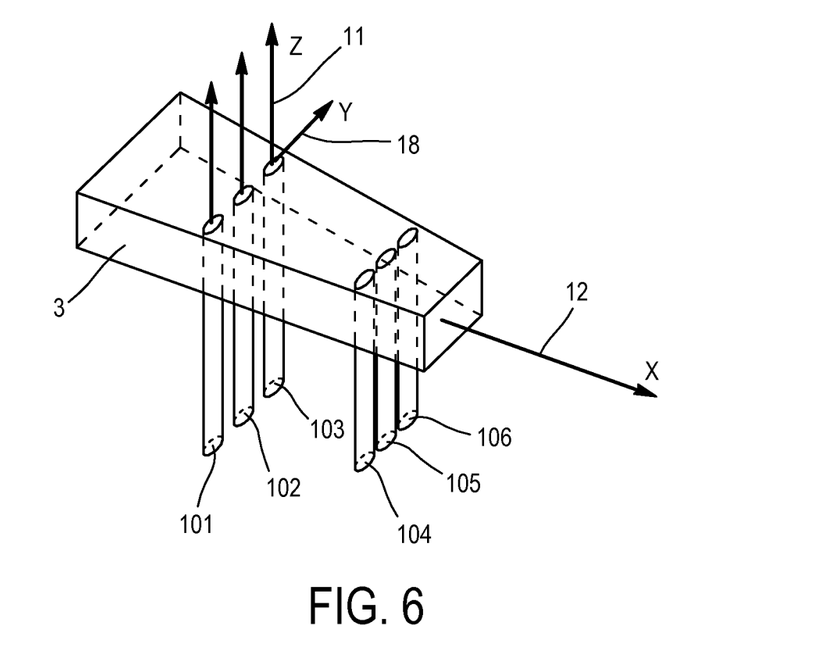
FIG. 6 is a perspective view of a first reaction flow alignment 101, 102, 103 accompanied by another optional reaction flow alignment 104, 105, 106.
Figure 7:
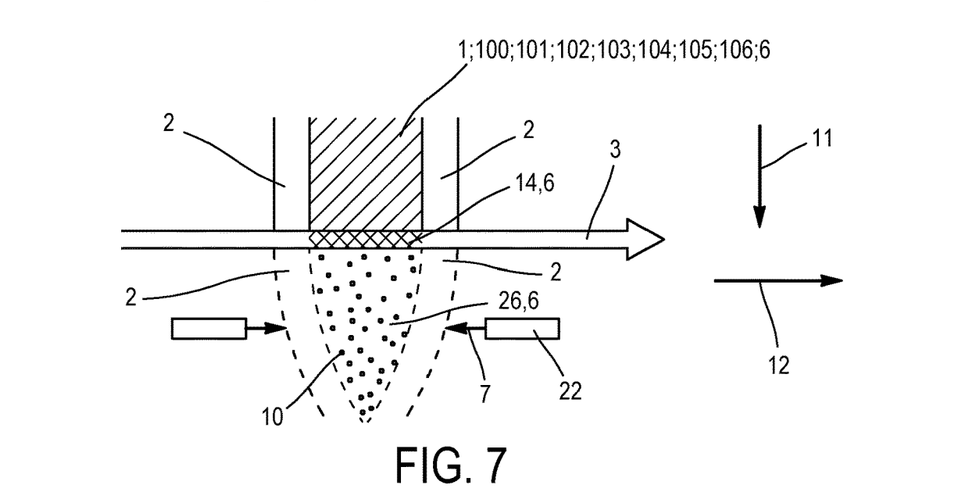
FIG. 7 is a diagrammatic side cross-section view of a reaction flow (which may be the flow 1, 100, 101, 102, 103, 104, 105 or 106 depending on the variant considered) and an annular injector 22 arranged in order to diffuse a peripheral gas flow 7.
Figure 8:
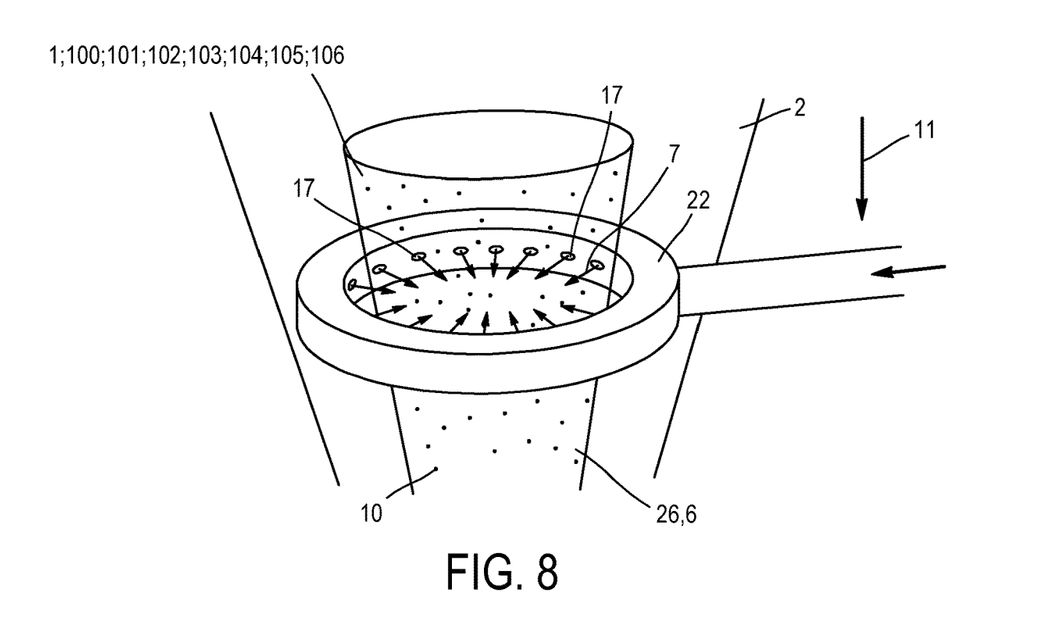
FIG. 8 is a diagrammatic perspective view of a reaction flow (which may be the flow 1, 100, 101, 102, 103, 104, 105 or 106 depending on the variant considered) and the annular injector 22.

In a fourth variant of the first embodiment of the device 9 which can correspond to the side cross-section view of FIG. 4 and the perspective view of FIG. 6, the injector 5 of at least one reaction flow is arranged in order to introduce, into the chamber 8 and originating from the reagent source 4, several alignments of reaction flows separated the ones from the others by the confinement gas flow 2 and each reaction flow comprising the first chemical element and each reaction flow propagating along the flow direction 11.

FIG. 6 shows a first flow alignment 101, 102, 103 and a second flow alignment 104, 105, 106.

Each flow 101, 102, 103, 104, 105 or 106 propagates along the flow direction 11 in a reaction flow zone 6 which is specific to it.

The injector 5 of at least one reaction flow is arranged so that the flows 101, 102, 103 or 104, 104 and 105 respectively (or more precisely their cross-section in a plane perpendicular to the flow direction 11) within each alignment are aligned along an alignment direction 18 perpendicular to the flow direction 11 and the radiation direction 12.

The flow alignments are spaced apart along the radiation direction 12.

The different flow alignments are parallel to one another in the same direction 18.

The injector 5 is subdivided into several injection nozzles (one nozzle per reaction flow). Each nozzle has a section which is typically an oval 3 mm deep in the direction 12 and 4 mm wide in the direction 13 or 18.

The losses due to absorption of the beam 3 by the first alignment of flows 101, 102, 103 are compensated by focussing (or "convergence") of the beam 3 so that the incident power density of the beam 3 on each alignment of flows 101, 102, 103 or 104, 105, 106 is identical for all the flows 101, 102, 103, 104, 105 or 106 according to the principle described in the document FR 2 877 591.

With reference to FIGS. 1 to 6, in the first embodiment of the device 9 according to the invention (irrespective of the variant thereof considered among the four variants thereof previously described), the injector of second chemical element is arranged in order to introduce the second element into the chamber 8 with the first chemical element in each reaction flow 1, 100, 101, 102, 103, 104, 105, 106 before (relative to flow direction 11) the interaction zone 14 of each reaction flow.

The injector of second chemical element includes the reagent injector 5. More precisely, the injector of second chemical element and the reagent injector 5 are merged.

With reference to FIGS. 1 to 6, a second embodiment of the device 9 according to the invention is strictly identical to the first embodiment of the device 9 previously described (irrespective of the variant thereof considered among the four variants thereof previously described), apart from the fact that the injector of second chemical element is arranged in order to introduce the second chemical element into the chamber 8 in a gas flow 2 surrounding each reaction flow 1, 100, 101, 102, 103, 104, 105, 106.

More precisely, the injector of second chemical element is arranged in order to introduce the second chemical element into the chamber 8 in the confinement gas flow 2 before (relative to flow direction 11) the interaction zone 14 of each reaction flow.

The injector of second chemical element includes the confinement gas injector 21. More precisely, the injector of second chemical element and the confinement gas injector 21 are merged.

This second embodiment is preferably implemented within the second or fourth variant (comprising one or more flow alignment(s) 101, 102, 103 and 104, 105, 106 of FIGS. 3 and 6) as this makes it possible to maximize the area of interaction between the confinement gas 2 comprising the second chemical element and each reaction flow comprising the first chemical element.

With reference to FIGS. 2 to 8, a third embodiment of the device 9 according to the invention is strictly identical to the first embodiment of the device 9 previously described (irrespective of the variant thereof considered among the four variants thereof previously described), apart from the fact that the injector of second chemical element is arranged in order to introduce the second chemical element into the chamber 8 in a gas flow 7 surrounding each reaction flow 1, 100, 101, 102, 103, 104, 105, 106.

The injector of second chemical element comprises one injector 22 (preferably of annular shape):
- per reaction flow 1, 100, 101, 102, 103, 104, 105, 106, or
- a common injector globally surrounding all the reaction flows.

For each reaction flow considered 1, 100, 101, 102, 103, 104, 105, or 106, the injector of second chemical element is arranged in order to introduce the second chemical element into the chamber 8 in a peripheral gas flow 7 surrounding that reaction flow 1, 100, 101, 102, 103, 104, 105, or 106 and emitted from several points 17 distributed along a closed curve (typically annular shape of the injector 22) surrounding that reaction flow and arranged in order to direct the peripheral gas flow 7 in the direction of that reaction flow.

For each reaction flow considered 1, 100, 101, 102, 103, 104, 105, or 106, the injector of second chemical element is arranged in order to introduce the second chemical element into the chamber 8 in the peripheral gas flow 7 after (relative to flow direction 11) the interaction zone 14 of that reaction flow. This is particularly advantageous as this makes it possible to have good control (by adjusting the power of the beam 3) and good homogeneity of production of the cores 15 of particles 10. The production of the layers 16 on the cores 15 of the particles does not directly take energy from the beam 3 and therefore does not impair the control exerted on the production of the cores 15. In fact, the production of the layers 16 on the cores 15 of the particles uses the energy of the flame 26 after the interaction zone 14.

This third embodiment of the device 9 includes means (not shown, comprising for example a micro-displacement plate) for displacing each injector 22 along the flow direction 11 so as to optimize the layer 16 produced for the particles 10.

Of course, the different variants and embodiments of the device according to the invention just described can be combined with one another, and the injector of second chemical element can thus comprise:
- the reaction flow injector 5, and/or (preferably and)
- at least one (optionally both) of:
  - the confinement gas injector 21, and/or
  - one injector 22 of peripheral gas 7 per reaction flow or a common injector 22 of peripheral gas 7 globally surrounding all the reaction flows.

There will now be described a process implemented in any one of the embodiments of the device 9 just described.

This process according to the invention for producing particles 10 by laser pyrolysis comprises the following steps:
- introducing into the reaction chamber 8, via the injector 5 and originating from the source 4, at least one reaction flow 1, 100, 101, 102, 103, 104, 105, 106 comprising the first chemical element and propagating along the flow direction 11; on its introduction, each reaction flow contains reagent; the typical flow rate of reagent introduced into the chamber 8 is approximately 20 litres per minute.
- introducing into the reaction chamber 8, before (relative to flow direction 11) the interaction zone 14 of each reaction flow, the confinement gas flow 2 surrounding each reaction flow 1, 100, 101, 102, 103, 104, 105, 106 and propagating along the flow direction 11; the typical flow rate of confinement gas introduced into the chamber 8 is approximately 50 litres per minute.
- projecting, via the emitter 19, the radiation beam 3 through the reaction chamber 8, intersecting each reaction flow 1, 100, 101, 102, 103, 104, 105, 106 into one interaction zone 14 per reaction flow in order to form in
- each reaction flow, particle cores 15 comprising the first chemical element, and
- introducing, into the reaction chamber 8, the second chemical element interacting with each reaction flow 1, 101, 102, 103, 104, 105, 106 in order to cover the particle cores 15 with a layer 16 (specific to each particle 10 and independent of the layer 16 of the other particles 10) comprising the second chemical element.

As seen above, the reagent of the reaction flows is devoid of agent oxidizing the first chemical element. Thus, the particle cores 15 obtained by the process according to the invention comprise the first chemical element in non-oxidized form.

The number of atoms of the second element introduced per unit of time (typically per minute) relative to the number of atoms of the first element introduced is a ratio of one atom of the second element introduced per unit of time (into the sum of the reaction flows 1, 100, 101, 102, 103, 104, 105, 106, confinement gas flow 2 and optionally, if they exist, peripheral flows 7) to at least two (preferably at least 3, optimally at least 5) atoms of the first element per unit of time (in the flow 1).

The number of atoms of the second element introduced per unit of time (typically per minute) relative to the number of atoms of the first element introduced is a ratio of one atom of the second element introduced per unit of time (into the sum of the reaction flows 1, 100, 101, 102, 103, 104, 105, 106, confinement gas flow 2 and optionally, if they exist, peripheral flows 7) to two (preferably three, optimally five) to fifty atoms of the first element per unit of time.

The radiation beam 3 propagates along the radiation direction 12 perpendicular to the flow direction 11.

Each reaction flow has, in a plane perpendicular to the flow direction 11, a cross-section extending longitudinally along the direction of elongation 13 perpendicular to the flow direction 11 and the radiation direction 12.

The particles 10 thus produced fall into a collector 27 where they are cooled before being passed by gravity and/or suction to an installation utilizing the particles or to a container for storage.

In the process according to the invention implemented in the first embodiment of the device according to the invention, the second chemical element is introduced into the chamber 8 with the first chemical element in the reagent in each reaction flow 1, 100, 101, 102, 103, 104, 105, 106 before (relative to flow direction 11) the interaction zone 14 of each reaction flow.

In the process according to the invention implemented in the second or third embodiment of the device according to the invention, the second chemical element is introduced into the chamber 8 in a gas flow 2 or 7 surrounding each reaction flow 1, 100, 101, 102, 103, 104, 105, 106 and in contact with each reaction flow 1, 100, 101, 102, 103, 104, 105, 106.

In the process according to the invention implemented in the second embodiment of the device according to the invention, the second chemical element is introduced into the chamber 8 in the confinement gas flow 2 before (relative to flow direction 11) the interaction zone 14 of each reaction flow.

This embodiment is particularly advantageous when, as previously described with reference to FIG. 3 or 6, the introduction of at least one reaction flow comprises introduction of several aligned reaction flows (alignment 101, 102, 103 and optionally also alignment 104, 105, 106) separated from one another by the confinement gas flow 2 and each reaction flow comprising the first chemical element and each reaction flow propagating along the flow direction 11. It is noted that in this case as illustrated in FIG. 3 the confinement gas flow 2 is preferably common to all the reaction flows and with no discontinuity between the different reaction flows. Furthermore, the radiation beam 3 propagates along the radiation direction 12 perpendicular to the flow direction 11, and the different reaction flows 101, 102, 103 or 104, 105, 106 within one alignment are aligned along the alignment direction 18 perpendicular to the flow direction 11 and the radiation direction 12.

In the process according to the invention implemented in the third embodiment of the device according to the invention, the second chemical element is introduced into the chamber 8 in a peripheral gas flow 7 surrounding each reaction flow 1, 100, 101, 102, 103, 104, 105, 106, emitted from several points 17 distributed along a closed curve surrounding each reaction flow and propagating in the direction of the reaction flows. The second chemical element is introduced into the chamber 8 in the peripheral gas flow 7 after (relative to flow direction 11) the interaction zone 14 of each reaction flow.

Of course, different combinations of process according to the invention previously described can be imagined, wherein the second chemical element is introduced into the chamber 8:

with the first chemical element into each reaction flow 1, 100, 101, 102, 103, 104, 105, 106, and/or (preferably and)

in a gas flow 2 or 7 surrounding each reaction flow 1, 100, 101, 102, 103, 104, 105, 106 and in contact with each reaction flow 1, 100, 101, 102, 103, 104, 105, 106, in particular:

in the confinement gas flow 2, and/or in one peripheral gas flow 7 per reaction flow or in a common peripheral gas flow 7 globally surrounding all the reaction flows.

Example 1

In this example, the first chemical element is silicon.

The first chemical element is introduced at ambient temperature (approximately 20° C.) into the chamber 8 in the form of gaseous $SiH_4$, at approximately 20 litres per minute.

The reagent in each reaction flow is thus gaseous silane ($SiH_4$) not mixed with oxidizing agents or oxygen atoms or molecules comprising oxygen atoms, but optionally mixed with a source ($C_2H_2$ or $C_2H_4$ or $CH_4$, preferably $C_2H_2$) of a second chemical element.

The cores 15 of particles 10 thus obtained are of non-oxidized silicon.

The confinement gas 2 comprises gaseous argon introduced into the chamber 8 at ambient temperature at 50 litres per minute, optionally mixed with a source ($C_2H_2$ or $C_2H_4$ or $CH_4$, preferably $C_2H_2$) of a second chemical element.

The second element is carbon.

The second element is introduced at ambient temperature into the chamber in the form of gaseous acetylene ($C_2H_2$) at very approximately 2 litres per minute, optionally for better results simultaneously distributed in the reaction flows (1, 100, 101, 102, 103, 104, 105, 106) and confinement flow 2, or reaction flows (1, 100, 101, 102, 103, 104, 105, 106) and peripheral flow 7 (for example at least 60% in the flows 2 and/or 7 surrounding the reaction flows and the remainder in the reaction flows).

The number of atoms of carbon (which here acts as the second element) introduced relative to the number of atoms of the first element (silicon) introduced is a ratio of one atom of carbon to five atoms of silicon (one mole of $C_2H_2$ for ten moles of $SiH_4$).

The layer 16 of each particle thus obtained is of carbon.

Particles Obtained

Particles according to the first example were produced with the first, second and third embodiment of the device 9 alone or in combination.

The size of the particles 10 obtained corresponds to a core diameter comprised between 10 and 500 nm (with a standard deviation between 2 and 60 nm), and a layer thickness 16 between 1 and 5 nm. The particles are not necessarily perfectly spherical. By core diameter is meant the distance linking the two most distant points of the core (for example the length in the case of a rod-shaped core).

Figure 9:
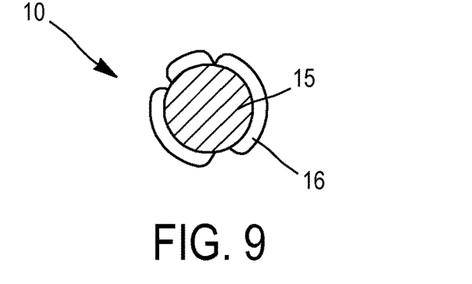
FIG. 9 is a diagrammatic side cross-section view of a particle produced according to the invention.

Using the first embodiment of the device according to the invention, for which the second chemical element is introduced into the chamber 8 with the first chemical element in each reaction flow 1, 100, 101, 102, 103, 104, 105, 106, it is observed that the layer 16 is not perfectly uniform, as illustrated in FIG. 9.

This may be due to the fact that according to the invention each reaction flow is devoid of agent oxidizing the first chemical element. The fact of not using any oxidizing agent is counter-intuitive, particularly in the case of a layer 16 of carbon, as oxidizing agents are known to dehydrogenate molecules such as $C_2H_4$, $C_6H_6$ etc. and thus to assist the formation of solid carbon.

Better results are observed from the second or third embodiment alone than from the first embodiment alone.

Figure 10:
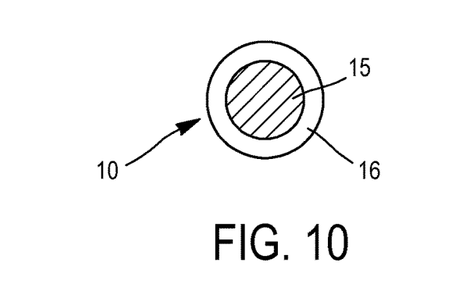
FIG. 10 is a diagrammatic side cross-section view of another particle produced according to the invention.

The homogeneity of the layer 16 can be markedly improved by using the second and/or third embodiment of the device according to the invention, wherein the second chemical element is introduced into the chamber 8 in a gas flow 2 or 7 surrounding each reaction flow 1, 100, 101, 102, 103, 104, 105, 106 and in contact with each reaction flow 1, 100, 101, 102, 103, 104, 105, 106, more particularly with the second embodiment of the device according to the invention for which the second chemical element is introduced into the chamber 8 in the confinement gas flow 2. The layer 16 is then much more homogeneous, as illustrated in FIG. 10.

Better results are again observed from the second and/or third embodiment combined with the first embodiment than from the second or third embodiment alone.

It is observed that in the examples and embodiments previously described the core 15 does not comprise the second chemical element (in any form).

It is observed that in the examples and embodiments previously described the layer 16 does not comprise the first chemical element (in any form).

It is observed that in the examples and embodiments previously described the core 15 preferably does not comprise the first chemical element in oxidized form, but preferably comprises this first chemical element only in non-oxidized form.

It is observed that in the examples and embodiments previously described there is no interface between the core 15 and the layer 16 of each particle described. However, it is observed that in general the invention is not incompatible with the existence of an interface between the core 15 and the layer 16 of the same particle.

Of course, the invention is not limited to the examples, embodiments and variants which have just been described and numerous adjustments can be made to these examples without exceeding the scope of the invention.

Of course, the different characteristics, forms, variants and embodiments of the invention can be combined with one another in various combinations insofar as they are not mutually incompatible or exclusive. In particular, all the variants and embodiments previously described can be combined with one another.

The invention claimed is:

1. A process for producing particles (10), comprising the following steps:
    introducing into a reaction chamber (8) at least one reaction flow (1, 100, 101, 102, 103, 104, 105, 106) comprising silicon as first chemical element and propagating along a flow direction (11),
    projecting a radiation beam (3) through the reaction chamber (8) intersecting each reaction flow (1, 100, 101, 102, 103, 104, 105, 106) in one interaction zone (14) per reaction flow, in order to form in each reaction flow, particle cores (15) comprising the first chemical element, and
    introducing, into the reaction chamber (8), a second chemical element interacting with each reaction flow (1, 100, 101, 102, 103, 104, 105, 106) in order to cover the particle cores (15) with a layer (16) comprising the second chemical element,
    each reaction flow (1, 100, 101, 102, 103, 104, 105, 106) being devoid of agent oxidizing the first chemical element, and the cores (15) of particles comprising the first chemical element in non-oxidized form, the second chemical element being introduced into the chamber (8) in a gas flow (2; 7) surrounding each reaction flow (1, 100, 101, 102, 103, 104, 105, 106), wherein the process comprises at least one step among the two following steps:
    a step of introducing the second chemical element into the chamber (8) in a peripheral gas flow (7) surrounding each reaction flow (1, 100, 101, 102, 103, 104, 105, 106), emitted from several points (17) distributed along a closed curve surrounding each reaction flow (1, 100, 101, 102, 103, 104, 105, 106) and propagating in the direction of each reaction flow, the second chemical element being introduced into the chamber (8) in the peripheral gas flow (7) after the interaction zone (14) of each reaction flow, and/or
    a step of introducing into the reaction chamber (8), before the interaction zone (14) of each reaction flow, a confinement gas flow (2) surrounding each reaction flow (1, 100, 101, 102, 103, 104, 105, 106) and propagating parallel to the flow direction (11), the second chemical element being introduced into the chamber (8) in the confinement gas flow (2) before the interaction zone (14) of each reaction flow.

2. The process according to claim 1, wherein the second chemical element is introduced into the chamber (8) in the peripheral gas flow (7) surrounding each reaction flow (1, 100, 101, 102, 103, 104, 105, 106), emitted from several points (17) distributed along the closed curve surrounding each reaction flow (1, 100, 101, 102, 103, 104, 105, 106) and propagating in the direction of each reaction flow, the second chemical element being introduced into the chamber (8) in the peripheral gas flow (7) after the interaction zone (14) of each reaction flow.

3. The process according to claim 1, further comprising a step of introducing into the reaction chamber (8), before the interaction zone (14) of each reaction flow, the confinement gas flow (2) surrounding each reaction flow (1, 100, 101, 102, 103, 104, 105, 106) and propagating along the flow direction (11), the second chemical element being introduced into the chamber (8) in the confinement gas flow (2) before the interaction zone (14) of each reaction flow.

4. The process according to claim 3, wherein the introduction of at least one reaction flow comprises introduction of at least one alignment of several reaction flows (101, 102, 103; 104, 105, 106) separated from one another by the confinement gas flow (2) and each reaction flow comprising the first chemical element and each reaction flow propagating along the flow direction (11).

5. The process according to claim 4, wherein the radiation beam (3) propagates along a radiation direction (12) perpendicular to the flow direction (11), and in that the flows of each reaction flow alignment (101, 102, 103; 104, 105, 106) are aligned along an alignment direction (18) perpendicular to the flow direction (11) and to the radiation direction (12).

6. The process according to claim 1, wherein the radiation beam (3) propagates along a radiation direction (12) perpendicular to the flow direction (11), and in that each reaction flow (1, 100, 101, 102, 103, 104, 105, 106) has, in a plane perpendicular to the flow direction (11), a cross-section extending longitudinally along an elongation direction (13) perpendicular to the flow direction (11) and the radiation direction (12).

7. The process according to claim 1, wherein the second chemical element is introduced into the chamber (8) with the first chemical element in each reaction flow (1, 100, 101, 102, 103, 104, 105, 106) before the interaction zone (14) of each reaction flow.

8. The process according to claim 1, wherein the first chemical element is introduced into the chamber (8) in the form of $SiH_4$.

9. The process according to claim 1, wherein the cores (15) of particles (10) are of silicon.

10. The process according to claim 1, wherein the second element is carbon.

11. The drocess according to claim 1, further comprising a step of introducing into the reaction chamber (8), before the interaction zone (14) of each reaction flow, the confinement gas flow (2) surrounding each reaction flow (1, 100, 101, 102, 103, 104, 105, 106) and propagating along the flow direction (11), the second chemical element being introduced into the chamber (8) in the confinement gas flow (2) before the interaction zone (14) of each reaction flow.

12. A device (9) for producing particles (10), comprising:
a reagent source comprising reagent, this reagent comprising silicon as first chemical element;
a reaction chamber (8) connected to the reagent source;
a reagent injector arranged in order to introduce, into the chamber (8) and originating from the reagent source, at least one reaction flow (1, 100, 101, 102, 103, 104, 105, 106) comprising said reagent and propagating along a flow direction (11) in one reaction flow zone (6) per reaction flow,
an emitter of a radiation beam arranged in order to project the radiation beam (3) through the reaction chamber (8) intersecting each zone (6) of reaction flow (1, 100, 101, 102, 103, 104, 105, 106) in one interaction zone (14) per reaction flow,
a source of a second chemical element, and
an injector of second element arranged in order to introduce, into the reaction chamber (8), the second chemical element from the source of second element so that this second chemical element is able to interact in the chamber (8) with each reaction flow (1, 100, 101, 102, 103, 104, 105, 106),
the reagent (1; 101, 102, 103) being devoid of agent oxidizing the first chemical element, the injector of second chemical element being arranged in order to introduce the second chemical element into the chamber (8) in a gas flow (2 or 7) surrounding each reaction flow (1, 100, 101, 102, 103, 104, 105, 106), wherein the device comprises at least one feature among the two following features:
the injector of second chemical element is arranged in order to introduce the second chemical element into the chamber (8) in a peripheral gas flow (7) surrounding each reaction flow (1, 100, 101, 102, 103, 104, 105, 106), emitted from several points (17) distributed along a closed curve surrounding each reaction flow and arranged in order to direct the peripheral gas flow in the direction of each reaction flow, the injector of second chemical element being arranged in order to introduce the second chemical element into the chamber (8) in the peripheral gas flow (7) after the interaction zone (14) of each reaction flow, and/or
the device comprises a confinement gas injector arranged in order to introduce into the reaction chamber (8), before the interaction zone (14) of each reaction flow, a confinement gas flow (2) surrounding each reaction flow (1, 100, 101, 102, 103, 104, 105, 106) and propagating parallel to the flow direction (11), and in that the injector of second chemical element comprises the confinement gas injector.

13. The device according to claim 12, wherein the injector of second chemical element is arranged in order to introduce the second chemical element into the chamber (8) in the peripheral gas flow (7) surrounding each reaction flow (1, 100, 101, 102, 103, 104, 105, 106), emitted from several points (17) distributed along the closed curve surrounding each reaction flow and arranged in order to direct the peripheral gas flow in the direction of each reaction flow, the injector of second chemical element being arranged in order to introduce the second chemical element into the chamber (8) in the peripheral gas flow (7) after the interaction zone (14) of each reaction flow.

14. The device according to claim 12, wherein the confinement gas injector is arranged in order to introduce into the reaction chamber (8), before the interaction zone (14) of each reaction flow, the confinement gas flow (2) surrounding each reaction flow (1, 100, 101, 102, 103, 104, 105, 106) and propagating along the flow direction (11), and in that the injector of second chemical element comprises the confinement gas injector.

15. The device according to claim 14, wherein the injector of at least one reaction flow is arranged in order to introduce into the chamber at least one alignment of several reaction flows (101, 102, 103; 104, 105, 106) separated from one another by the confinement gas flow (2) and each reaction flow comprising the first chemical element and each reaction flow propagating along the flow direction (11).

16. The device according to claim 15, wherein the emitter is arranged so that the radiation beam (3) propagates along a radiation direction (12) perpendicular to the flow direction (11), and in that the injector of at least one reaction flow is arranged so that the flows of each reaction flow alignment (101, 102, 103; 104, 105, 106) are aligned along an alignment direction (18) perpendicular to the flow direction (11) and the radiation direction (12).

17. The device according to claim 12, wherein the emitter is arranged so that the radiation beam (3) propagates along a radiation direction (12) perpendicular to the flow direction (11), and in that the injector of at least one reaction flow is arranged so that each reaction flow (1, 100, 101, 102, 103, 104, 105, 106) has, in a plane perpendicular to the flow direction (11), a cross-section extending longitudinally along an elongation direction (13) perpendicular to the flow direction (11) and to the radiation direction (12).

18. The device according to claim 12, wherein injector of second chemical element is arranged in order to introduce the second element into the chamber (8) with the first chemical element in each reaction flow (1, 100, 101, 102, 103, 104, 105, 106) before the interaction zone (14) of each reaction flow.

* * * * *